United States Patent [19]

Reed

[11] 3,771,100

[45] Nov. 6, 1973

[54] PRINTED CIRCUIT BRIDGING CONNECTOR

[75] Inventor: Norman Leonard Reed, Cheshunt, England

[73] Assignee: AMP Incorporated, Harrisburg, Pa.

[22] Filed: Nov. 8, 1971

[21] Appl. No.: 196,320

[30] Foreign Application Priority Data

Nov. 20, 1971 Great Britain .................. 55,236/70

[52] U.S. Cl. .......... 339/17 LM, 339/64 M, 339/65, 339/176 MP, 339/217 R

[51] Int. Cl. ........................ H01r 13/54, H05k 1/02

[58] Field of Search ............. 339/17 R, 17 F, 17 M, 339/17 LM, 75 M, 75 MP, 64, 65, 66, 156, 176, 217, 99

[56] References Cited

UNITED STATES PATENTS

| | | | |
|---|---|---|---|
| 3,437,977 | 4/1969 | Gammel et al | 339/17 R |
| 3,107,319 | 10/1963 | Vizzier | 339/17 LM X |
| 3,188,601 | 6/1965 | De Tar | 339/75 MP |
| 3,482,201 | 12/1969 | Schneck | 339/176 MP X |

*Primary Examiner*—Marvin A. Champion
*Assistant Examiner*—Terrell P. Lewis
*Attorney*—William J. Keating et al., Gerald K. Kita, John R. Flanagan and Allan B. Osborne

[57] ABSTRACT

A printed circuit edge connector including a contact which is integrally formed by folding a sheet metal blank and comprising a pair of elongate spring arms supported longitudinally spaced apart at one of their ends by an elongate body portion, the arms extending in opposite directions away from their supported ends towards the supported end of the other arm so that they overlap or cross. Contact portions are located at the free ends of each arm adjacent the supported end of the other arm, the contact portions facing away from the body, and the spring arms being flexible in a sense to permit movement of the contact portions to and away from the body portion. The contact is mounted in a slot in a carrier block of insulating material by latch arms formed on the body portion to project away from the spring arms and engage a shoulder formed on the block.

4 Claims, 2 Drawing Figures

PRINTED CIRCUIT BRIDGING CONNECTOR

This invention relates to a printed circuit edge connector for interconnecting a pair of printed circuit boards or platters in generally co-planar relationship.

Printed circuit edge connectors for connecting circuit conductors to printed circuit paths at an edge of the board are well known and many different forms have been proposed. It is a common requirement, for example in computers, to interconnect printed circuit boards or platters comprising multi-layer printed circuits in generally co-planar relationship in order to interconnect selected circuits of the boards in predetermined relation, and to arrange such interconnections in stacks to accommodate large numbers of board interconnections in a small space. In such an arrangement series of boards or platters may be arranged in generally co-planar relation so that the stack is extended in width as well as in height. Since such arrangements are intended to reduce the space requirement for circuitry, it is desirable that the printed circuit connector occupies minimal space between and in overlapping relation with respect to adjacent co-planar boards. A difficulty is presented in that adjacent boards or platters may be of substantially different thicknesses and any contact must be capable of accommodating such thickness variation without loss of performance. A known means of accommodating such thickness variation is the provision of elongate contact springs which has previously resulted in an excessively wide connector.

A printed circuit edge connector for inter-connecting a pair of printed circuit boards, according to the present invention comprises a contact having a pair of contact portions for engaging respective boards and spaced longitudinally of an elongate body portion, the contact portions being disposed at the free ends of respective spring arms integrally formed at their other supported ends with the body portion, the supported ends being longitudinally spaced apart and the spring arms extending longitudinally of the body portion in opposite directions towards their respective contact portions, each of which is disposed adjacent the supported end of the other arm on a side of the arm remote from the body portion, the arms being resiliently flexible in a sense to permit movement of the contact portions towards and away from the body portion.

Suitably the contact is formed from a sheet metal blank with the arms disposed at opposite sides of a body forming portion, which is folded to present a body portion of double thickness with the springs extending in side-by-side relationship.

The body portion may be integrally formed with a pair of resilient latch arms projecting away from the body on the side opposite the spring arms, to facilitate secure mounting of the contact. The body portion is suitably formed at a central location between the latch arms with a flange projecting away from the spring arms arranged to engage a slot in an insulated block, having at each end of the slot a shouldered block portion for engaging a respective latch arm of the contact.

The invention will now be described, by way of example, with reference to the accompanying partly diagrammatic drawings, in which.

Figure 1:
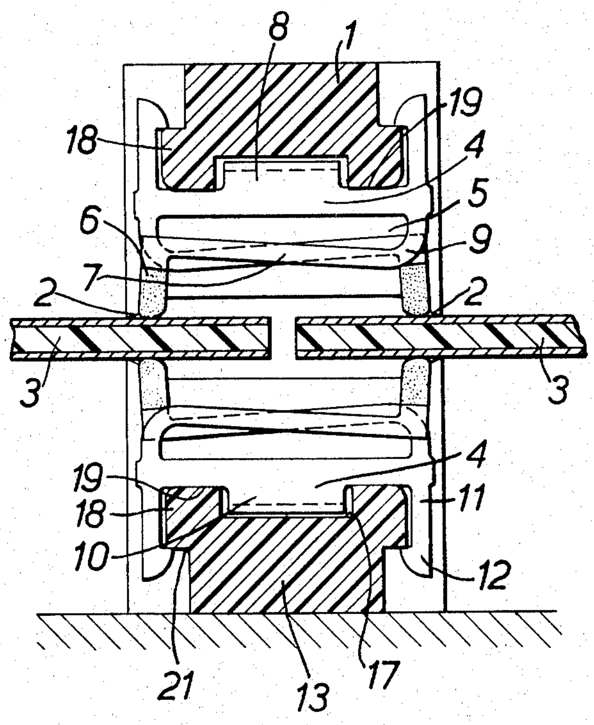
FIG. 1 is a sectional elevation of a printed circuit platter connector.

The connector of FIG. 1 comprises a two-part insulating block 1 comprising upper and lower parts on the identical form, disposed one on top of the other to define between the blocks a slot 2 for receiving edges of generally co-planar printed circuit boards or platters 3 in edge-to-edge substantially abutting relationship. Each of the parts of the block 1 is of generally rectangular cross-section, and is suitably provided at its ends, not shown, with spacer projections for separating the upper and lower parts of the block and defining between the projections the slot 2. Each platter 3 suitably comprises a multi-layer printed circuit board and respective upper surface conductors of the platters and respective lower surface conductors are interconnected by bridging contacts 4 disposed in the respective block parts. Each block part is suitably formed with a series of contact receiving recesses 5, each containing a contact 4 so that the surface conductors of a series on one platter may be respectively interconnected with surface conductors of the other platter.

Figure 2:
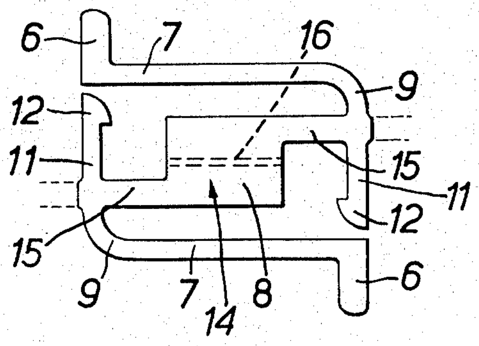
FIG. 2 is a plan view of a contact of the assembly of FIG. 1 in flat blank form.

Each contact 4 comprises a pair of contact portions 6 projecting over respective spring arms 7 integrally formed with a common body portion 8 of elongate form. The spring arms 7 at their supported ends, extend from opposite ends of the body portion 8 at arcuate root portions 9 from which major portions of the spring arms 7 extend in spaced generally parallel relationship with respect to the body portion 8, as seen in FIG. 2. Each spring arm 7 extends over its root portion 9 towards the opposite end of the body portion where the contact portion 6 projects from the spring arm in generally perpendicular manner in a side opposite the body portion. The contact portions 6 are formed with arcuate contact faces and each is disposed adjacent the root 9 of the spring arm 7 of the other contact portion, the spring arm 7 extending in side-by-side overlapping relationship, as seen in FIG. 1.

The body portion 8 is formed centrally on a side opposite the spring arms 7 with a rectangular flange 10 and at ends of the body portion 8 spaced from the flange, the body portion is formed with latch arms 11, formed with latch heads 12 for engaging a block portion 13 between them.

Each contact 4 is suitably formed from a flat blank, as seen in FIG. 2, with the spring arms 7 formed on opposite sides of a central rectangular body forming portion 14 over which body arms 15 extend at diagonally opposite corners in parallel relation with respect to the arms 7. The body forming portion 14 is folded along a fold line 16 extending parallel with the arms 7 and midway between them to define the body portion 8 and flange 10 in double thickness over which the body arms 15 project in alignment from opposite ends of the flange 10.

Each contact recess 5 in the parts of block 1 is formed remote from the slot forming portion 2 with a bridge portion 13 defining a roof or floor to the recess as seen in FIG. 1. The bridge portions 13 are of generally rectangular section and each is formed on its side facing the slot 2, with a central rectangular slot 17 for receiving the flange 10 of the associated contact 4. Each side of the bridge portion 13 is formed with a generally rectangular protuberance 18 defining surface 19 facing the slot 2 for supporting the body arms 15 at opposite sides of flange 10. The protuberances 18 on each part of the block 1 at their remote sides are engaged between the latch arms 11 of the associated contact with the latch heads 12 engaging shoulder surfaces 21 of the protuberances 18 on sides remote from the slot 2.

The contacts 4 can be snap-fitted into their respective recesses 5 by pushing the latch arms 11 against the protuberances 18 of the appropriate bridge portions 13 to deflect latch heads 12 apart until they engage the shoulders 21 in a snap-fit.

In use, the contact portions 6 initially project into the platter slot 2 and suitably the platters are positioned as shown in FIG. 1, above the contacts 4 of the lower part of the block 1, before assembling the upper part of the block 1 to the lower part. On engaging the respective platters, the contact portions 6 are deflected into their recess by flexure of the spring arms 7 and the spring arms of any one contact may be deflected by different amounts to accommodate different thicknesses of platter on the opposite sides of the block 1.

I claim:

1. A printed circuit edge connector for interconnecting a pair of printed circuit boards, comprising a contact having a pair of contact portions for engaging respective boards and spaced longitudinally of an elongate body portion, the contact portions being disposed at the free ends of respective spring arms integrally formed at their other supported ends with the body portion, the supported ends being longitudinally spaced apart and the spring arms extending longitudinally of the body portion in opposite directions towards their respective contact portions, each of said respective contact portions being disposed adjacent the supported end of the other arm on a side of the arm remote from the body portion, the arms being resiliently flexible in a sense to permit movement of the contact portions towards and away from the body portion.

2. An edge connector according to claim 1, in which the contact is formed from a sheet metal blank with the arms disposed at opposite sides of a body forming portion, which is folded to present a body portion of double thickness with the springs extending in side-by-side relationship.

3. An edge connector according to claim 1, in which the body portion is integrally formed with a pair of resilient latch arms projecting away from the body on the side opposite the spring arms, to facilitate secure mounting of the contact.

4. An edge connector according to claim 3, in which the body portion is formed at a central location between the latch arms with a flange projecting away from the spring arms arranged to engage a slot in an insulated block, having at each end of the slot a shouldered block portion for engaging a respective latch arm of the contact.

* * * * *